United States Patent [19]
Hardy et al.

[11] Patent Number: 5,920,239
[45] Date of Patent: Jul. 6, 1999

[54] MULTIPLE DWELLING UNIT TAP OFF INCLUDING AN EQUALIZER CIRCUIT

[75] Inventors: Gregory K. Hardy, Atlanta; Mark A. Palazzo, Grayson; Bart F. Spriester, Duluth, all of Ga.

[73] Assignee: Scientific-Atlanta, Inc., Norcross, Ga.

[21] Appl. No.: 08/946,002

[22] Filed: Oct. 7, 1997

[51] Int. Cl.$^6$ ...................................................... H01P 5/12
[52] U.S. Cl. ............................................ 333/100; 333/136
[58] Field of Search ...................................... 333/124, 125, 333/131, 136, 100

[56] References Cited

U.S. PATENT DOCUMENTS

| | | | |
|---|---|---|---|
| 4,578,702 | 3/1986 | Campbell, III | 333/136 X |
| 5,058,198 | 10/1991 | Rocci et al. | 333/136 X |
| 5,648,745 | 7/1997 | Spriester et al. | 333/136 X |

*Primary Examiner*—Benny Lee
*Attorney, Agent, or Firm*—Kenneth M. Massaroni; Kelly A. Gardner; Hubert J. Barnhardt III

[57] ABSTRACT

The present invention provides a tap off unit for use in a multiple dwelling unit. The tap off unit includes a housing having an input terminal and an output terminal for interposing the tap off unit in a cable signal line, a plurality of taps disposed within the housing, with each tap having a faceplate including associated signal coupling circuitry, and a circuitry board disposed within the housing. The circuitry board distributes a signal from the cable signal line to each of the plurality of taps within the housing and the plurality of taps are connected in parallel such that one of the plurality of taps may be removed without disruption of the signal to the remaining taps.

7 Claims, 1 Drawing Sheet

MULTIPLE DWELLING UNIT TAP OFF INCLUDING AN EQUALIZER CIRCUIT

TECHNICAL FIELD

The present invention relates to a tap off for a coaxial cable distribution system and, more particularly, to a tap off housing having more than one directional tap and more than one associated circuitry faceplate within the single tap off housing.

BACKGROUND OF THE INVENTION

A cable television distribution system generally collects commercial programming from large "off air" television antennas, a satellite receiving station, or locally originated signals and then distributes these signals to individual subscribers via coaxial cable or fiber optics. The collected signals are processed in the headend, then combined and routed to form a serving signal to the subscriber through fiber and/or trunk and feeder paths of the distribution system. The fiber and trunk system transport high quality headend signals to the feeder system, which in turn provides signals to the end user. This type of broadband distribution system can be a single or dual cable system and a forward only or two way system.

The signal travels along the feeder cable until it reaches the location of the first subscriber (or subscribers). At this point, it is necessary to tap off signal from the feeder cable so that it can be delivered to the subscriber(s) residence. The device used to tap signal off from the feeder cable is called a directional tap. A tap generally includes a housing unit having a base member and a cover or faceplate attached thereto. The faceplate includes the integral printed wiring or distribution circuitry for distributing the signal to each of the subscribers served by the tap. The number of individual subscribers to be fed from a single location determines the type of tap to be used. Common prior art taps include two-port, four-port and eight-port taps, where each port is connected to a drop cable that provides the cable signal to a subscriber. The signal level required at the tap port is dictated by the signal level input requirements of the subscriber, as determined by the number of television receiver devices, video recorders, and the like that are to be connected to the system and the distance between the tap and the subscriber.

For sub-division communities of single family residences, each tap off location from the feeder cable is connected to a two-port, four-port or eight-port tap and a drop cable from each port is in turn connected to the residence of each subscriber. For multiple dwelling units such as apartment buildings, however, each tap off location from the feeder cable is generally connected to three or more eight-port taps, which are connected in series by coaxial cable (three such taps serving as many as twenty-four subscribers). Due to frequency dependent transmission losses in coaxial cables, signal levels tend to diminish as the signal propagates away from the transmission source. Thus, connecting a plurality of taps by coaxial cables diminishes the signal quality received by the subscriber further downstream. If one of the taps for the multiple dwelling unit fails and must be replaced or serviced, the result is a disruption in the signal, and thus the cable service, for all remaining subscribers farther down the cable and away from the headend. In addition, cable handling becomes more complicated and burdensome for the service technician due to the physical interconnection of the plurality of taps.

SUMMARY OF THE INVENTION

The present invention overcomes these disadvantages of the prior art by providing a tap off unit for use in a multiple dwelling unit. The tap off unit includes a housing having an input terminal and an output terminal for interposing the tap off unit in a cable signal line, a plurality of taps disposed within the housing where each tap has a faceplate including the associated signal coupling circuitry for the subscriber ports, and a circuitry board disposed within the housing for distributing a signal from the cable signal line to each of the plurality of taps within the housing. The plurality of taps are connected in parallel such that one of the taps may be removed without disruption of the signal to the remaining taps within the housing.

The circuitry board preferably includes at least one signal equalizer such that a signal level is provided to each tap that is equalized across the bandwidth of the serving signal. Each tap includes a predetermined number of subscriber ports and includes a predefined signal padding level within the faceplate thereof. In addition, the circuitry board may include at least one power input, a local power injector, and a power jumper such that power may be supplied by either the power from the cable line or the local power injector.

Various additional advantages and features of novelty which characterize the invention are further pointed out in the claims that follow. However, for a better understanding of the invention and its advantages, reference should be made to the accompanying drawings and descriptive matter which illustrate and describe preferred embodiments of the invention.

DETAILED DESCRIPTION OF THE PREFERRED EMBODIMENTS

Figure 1:
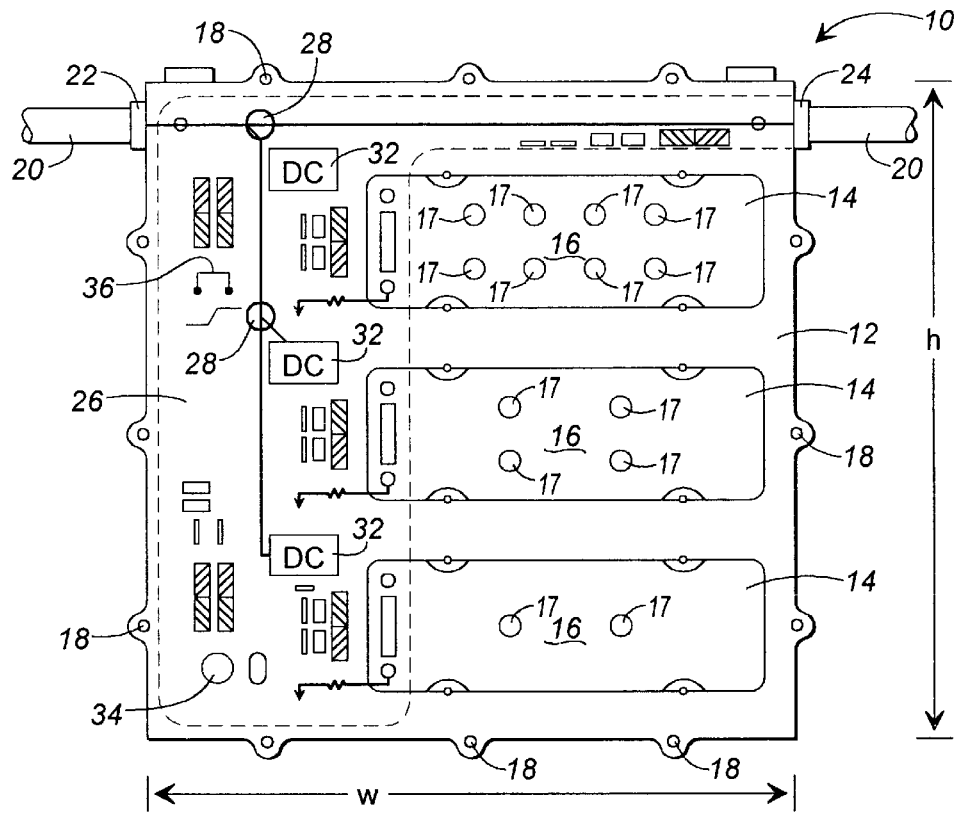
FIG. 1 is a schematic representation of a tap off unit in accordance with a first embodiment of the present invention.

Referring to FIG. 1, a tap off unit in accordance with a preferred embodiment of the present invention is shown generally by reference numeral 10. Tap off unit 10, by way of example, will serve twenty-four subscribers but in alternative embodiments may serve fewer or more subscribers as desired. Tap off unit 10 is preferably used in a multiple dwelling unit, such as an apartment complex, in order to efficiently and neatly provide a maximum number of subscriber ports. Tap off unit 10 includes a sealed housing 12 and a cover (not shown) that is connected thereto by screws that are inserted into screw holes 18. Preferably, housing 12 has an overall width "w" of approximately fifteen inches and an overall height "h" of approximately fourteen inches.

Within each tap off unit 10 are a plurality of taps, preferably three taps 16, each having an associated faceplate 14 containing the integral printed wiring or circuitry for distributing the signal to each subscriber. The circuitry for taps 16 is disclosed in U.S. Pat. No. 5,581,801 filed Mar. 21, 1995 and issued Dec. 3, 1996 to Spriester et al. for "Apparatus for Distributing RF Signals and AC Power to Taps" and U.S. Pat. No. 5,648,745 filed Mar. 21, 1995 and issued Jul. 15, 1997 to Spriester et al. for "Non-Interruptible Tap and Method", the entire contents of which are hereby incorporated by reference. Each tap 16 preferably has eight subscriber ports 17 so as to service a maximum number of subscribers while creating the least interruption should a tap fail. It will be recognized by one skilled in the art, however, that a two port, four port, sixteen port or any other configuration of tap could, of course, also be used for each tap 16. The plurality of taps 16 within unit 10 may have either the same or a differing number of subscriber ports 17. For example, one tap 16 may have eight ports 17 (shown as the upper tap in FIG. 1), another four ports 17 (shown as the middle tap in FIG. 1), and a third two ports 17 (shown as the lower tap in FIG. 1) depending upon the demand for service. Similarly, three sixteen port taps 16 (although not shown in FIG. 1) may be used to provide service for up to forty-eight subscribers from the same tap off unit 10. A feeder cable 20 is connected to input terminal 22 and to output terminal 24 so as to tap the signal from the feeder cable and thereby provide the required AC and RF signal for tap off unit 10.

Disposed within housing 12 is a circuitry board 26 to which taps 16 are attached. Circuitry board 26 includes a plurality of signal couplers 28 for distributing the AC and RF signal from feeder cable 20 to the taps 16. As shown more clearly in FIG. 2, circuitry board 26, 26' may also include a plurality of signal equalizers 30 to ensure that each tap 16, 16' receives an equal strength signal level across the serving bandwidth. According to the present invention, and as depicted in FIG. 1 a plurality of taps 16 may be combined within a single housing 12 and connected in parallel by circuit board 26 rather than being connected in series with coaxial cable as in the prior art. Thus, should a tap 16 require service or should it fail and need to be replaced, it is merely necessary to remove the cover (not shown) from housing 12 and thereafter remove the damaged tap 16 and/or the faceplate 14 thereof When the damaged tap 16 or faceplate 14 is removed, the cable signal will be disrupted to those eight subscribers serviced by that one particular tap 16, assuming it is an eight port tap. Unlike the prior art, however, the cable signal will not be disrupted for the remaining subscribers serviced by the remaining two taps within tap off unit 10. Therefore, rather than inconveniencing a potential twenty-four (or more) cable subscribers as in the prior art, only eight subscribers will lose their cable signal during the repair or replacement of the eight port tap 16.

The amount of signal energy provided by each tap 16 to a subscriber depends primarily upon two factors, the available signal energy at the tap and the padding level of the tap. Generally, taps having a relatively large padding are used near the start of the cable line where the signal is strong and taps having a relatively small amount of padding are used near the end of the cable line where the signal is weaker. A cable television distribution system is desirably configured so that each subscriber receives approximately the same signal level. Accordingly, there must be a relatively large number of different types of taps available in order to meet this goal. By way of example, each tap 16 may be padded at 14, 20, 23, 26 or 29 dB below the signal level input in order to provide the proper signal attenuation to subscribers who may be close or distant from tap off unit 10 and/or the headend. Thus, different padding levels of taps should be available for each configuration of tap, i.e., four port, eight port, etc., in order for the tap off unit 10 to be most efficiently serviced. The padding level and the number of ports 17 of the tap 16 is generally provided by the individual faceplate 14, and it is not required that each faceplate 14 provide the same signal attenuation for each tap 16. Thus, if it is necessary to change the signal level at one tap 16 due to the addition of further televisions or video recorders for example, the faceplate 14 for that one tap 16 may be changed without disruption of service to subscribers serviced by the remaining taps 16 within unit 10. This change of faceplate 14 is accomplished merely by removing the old faceplate on the tap and replacing it with the new faceplate that will provide the desired signal attenuation.

As shown in FIG. 1, in addition to the above-mentioned features, circuitry board 26 also includes a plurality of power inputs 32 that provide power to each faceplate 14, preferably approximately 2 amps/faceplate. A local power injector 34 may also be provided to supply additional power, preferably up to 7 amps. An AC jumper 36 may also be provided such that power may be supplied from either the main feeder cable 20 or from the local power injector 34. In a preferred embodiment of the present invention, the input power through feeder cable 20 is approximately 15 amps and the output power therethrough is approximately 7–10 amps.

Figure 2:
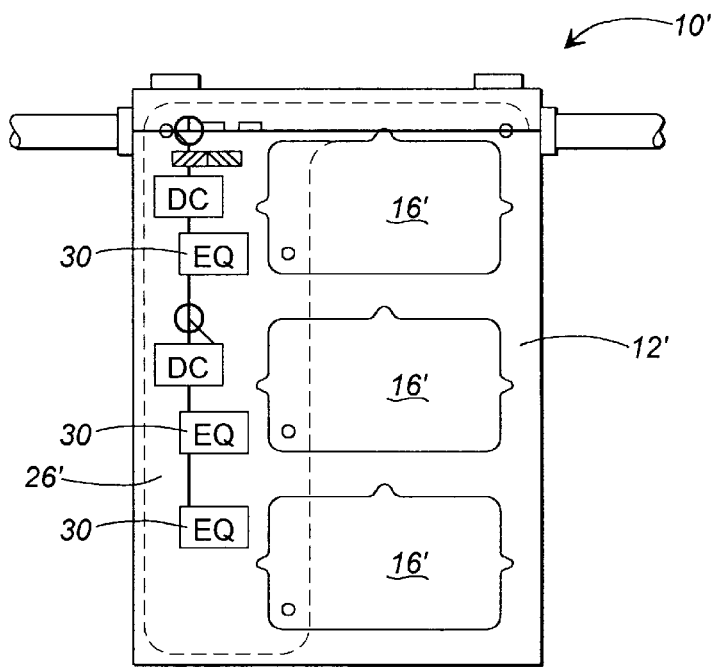
FIG. 2 is a schematic representation of a tap off unit in accordance with a second embodiment of the present invention.

Referring to FIG. 2, a further embodiment of the present invention is shown. In this embodiment, housing 12' has an approximate overall width of nine inches and an approximate overall height of thirteen inches. Each tap 16' is padded at 11 dB. As in the previous embodiment, circuitry board 26' is provided to couple the signal from the feeder cable to each of the taps 16' in parallel. As a result, each tap 16' may be removed for repair or replacement without disruption of the cable service to the remaining subscribers serviced by tap off unit 10'.

From the foregoing detailed description, it will be evident that there are a number of changes, adaptations and modifications of the present invention which come within the province of those persons having ordinary skill in the art to which the aforementioned invention pertains. However, it is intended that all such variations not departing from the spirit of the invention be considered as within the scope thereof as limited solely by the appended claims.

We claim:

1. A tap off unit comprising:

a housing having an input terminal and an output terminal for interposing said tap off unit in a cable signal line;

a plurality of taps disposed within said housing, each said tap having a faceplate including associated signal coupling circuitry;

a circuitry board disposed within said housing;

wherein said circuitry board is coupled to said input and output terminals such as to distribute a signal from the cable signal line to each of said plurality of taps within said housing and wherein said circuitry board includes at least one signal equalizer such that the signal provided to each tap is equal in level.

2. The tap off unit of claim 1 wherein said plurality of taps are connected in parallel such that one or more of said plurality of taps can be removed without disruption of the signal to the remaining taps.

3. The tap off unit of claim 1 wherein said circuitry board includes at least one power input.

4. The tap off unit of claim 1 wherein each tap includes a respective predetermined number of subscriber ports.

5. The tap off unit of claim 4, wherein each tap includes a respective predefined signal padding level.

6. The tap off unit of claim 1 wherein said circuitry board includes a local power injector.

7. The tap off unit of claim 6 wherein said circuitry board includes a power jumper such that power can be supplied by one of the cable line and said local power injector.

* * * * *